United States Patent
Ishida et al.

(10) Patent No.: US 9,210,791 B2
(45) Date of Patent: Dec. 8, 2015

(54) COOLING BLOCK FORMING ELECTRODE

(71) Applicant: TOKYO ELECTRON LIMITED, Tokyo (JP)

(72) Inventors: Toshifumi Ishida, Nirasaki (JP); Daisuke Hayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/667,226

(22) Filed: Nov. 2, 2012

(65) Prior Publication Data

US 2013/0168369 A1 Jul. 4, 2013

Related U.S. Application Data

(62) Division of application No. 12/876,597, filed on Sep. 7, 2010, now Pat. No. 8,319,141, which is a division of application No. 11/708,677, filed on Feb. 21, 2007, now abandoned.

(60) Provisional application No. 60/781,760, filed on Mar. 14, 2006.

(30) Foreign Application Priority Data

Feb. 24, 2006 (JP) .................................. 2006-048956

(51) Int. Cl.
*B23K 9/00* (2006.01)
*H05B 3/68* (2006.01)
*H05H 1/46* (2006.01)
*H01J 37/32* (2006.01)

(52) U.S. Cl.
CPC ............ *H05H 1/46* (2013.01); *H01J 37/32009* (2013.01); *H01J 37/32724* (2013.01)

(58) Field of Classification Search
USPC ................. 219/443.1, 444.1, 121.36–121.44; 118/724, 725; 156/345.51–345.53
See application file for complete search history.

(56) References Cited

U.S. PATENT DOCUMENTS

| 5,005,285 | A | 4/1991 | Ishii | |
|---|---|---|---|---|
| 5,697,428 | A | 12/1997 | Akachi | |
| 5,732,767 | A | 3/1998 | Saperstein | |
| 6,147,334 | A | 11/2000 | Hannigan | |
| 6,677,167 | B2 * | 1/2004 | Kanno et al. | 438/14 |
| 6,686,052 | B2 | 2/2004 | Jogan et al. | |
| 6,717,115 | B1 | 4/2004 | Pfahnl et al. | |
| 6,838,012 | B2 | 1/2005 | Lenz | |
| 6,916,399 | B1 * | 7/2005 | Rozenzon et al. | 156/345.37 |

(Continued)

FOREIGN PATENT DOCUMENTS

JP 2002-086295 3/2002

*Primary Examiner* — Sang Y Paik
(74) *Attorney, Agent, or Firm* — Smith, Gambrell & Russell LLP.

(57) ABSTRACT

The present invention is a cooling block that forms an electrode for generating a plasma for use in a plasma process, and includes a channel for a cooling liquid, the cooling block comprising: a first base material and a second base material respectively made of aluminum, at least one of the first and second base materials having a recess for forming a channel for a cooling liquid; and a diffusion bonding layer, in which zinc is diffused in aluminum, and an anti-corrosion layer of a zinc oxide film, the layers being formed by interposing zinc between the first and second base materials, and by bonding the first and second base materials with zinc interposed therebetween in a heating atmosphere containing oxygen.

16 Claims, 8 Drawing Sheets

(56) References Cited

U.S. PATENT DOCUMENTS

| | | | |
|---|---|---|---|
| 8,319,141 B2* | 11/2012 | Ishida et al. | 219/121.43 |
| 2005/0000442 A1* | 1/2005 | Hayashi et al. | 118/723 E |
| 2006/0027625 A1* | 2/2006 | Dockus et al. | 228/56.3 |
| 2006/0102328 A1* | 5/2006 | Toyama et al. | 165/133 |
| 2007/0251602 A1* | 11/2007 | Gagnon et al. | 148/26 |

* cited by examiner

COOLING BLOCK FORMING ELECTRODE

CROSS REFERENCE TO RELATED APPLICATION

This application is a division of application Ser. No. 12/876,597 filed Sep. 7, 2010, which is a division of Ser. No. 11/708,677 filed Feb. 21, 2007 (now abandoned), which claims priority from U.S. Provisional Application No. 60/781,760 filed Mar. 14, 2006 and Japanese Patent Application No. 2006-048956, filed Feb. 24, 2006, and which are being incorporated in their entirety herein by reference.

FIELD OF THE INVENTION

The present invention relates to a cooling block forming an electrode for generating a plasma for use in a plasma process, and to a plasma processing apparatus using the cooling block.

BACKGROUND ART

Figure 9:
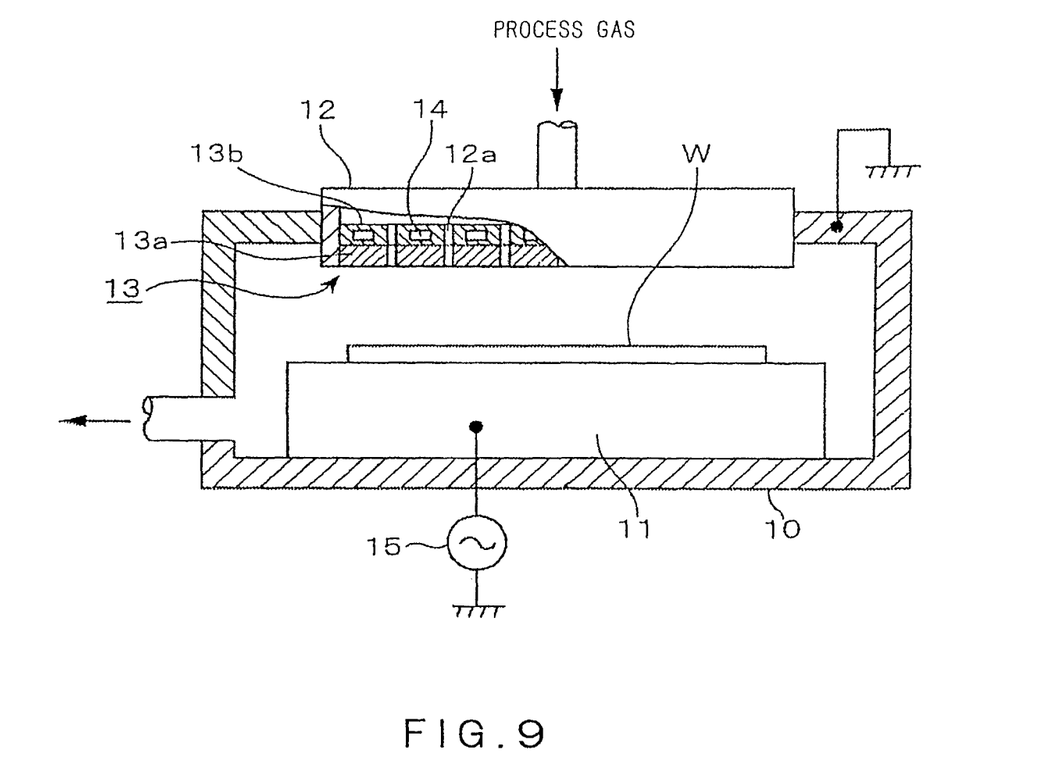
FIG. 9 is a schematic sectional view of a conventional plasma processing apparatus.

In a process for manufacturing semiconductor devices or the like, a plasma process using a plasma is frequently performed. As shown in FIG. 9, a plasma processing apparatus for the plasma process includes, for example, a process vessel 10 of a vacuum chamber, and a stage 11 disposed in the process vessel 10 for supporting thereon a semiconductor wafer (hereafter referred to as "wafer") as a substrate. The stage 11 also serves as a lower electrode. A showerhead 12 having a number of gas supply holes 12a is arranged above the stage 11. An upper electrode 13 is disposed on a lower surface of the showerhead 12. The upper electrode 13 is formed of an electrode plate 13a and a cooling block 13b.

A radio-frequency for generating plasma is applied between the upper electrode 13 and the lower electrode 11 (stage 11) from a radio-frequency power source 15. Thus, a plasma is generated in a process space between the stage 11 and the upper electrode 13. The plasma activates a process gas supplied from the showerhead 12 into the process vessel 10, and then the wafer W on the stage 11 is subjected to a plasma process such as an etching process and a film-deposition process.

A structure and properties of the upper electrode 13 in the process vessel have an impact on the plasma process. Specifically, in a plasma etching process, for example, an in-plane uniformity or inter-plane uniformity in etching rate of the wafer(s) W is affected by the structure and properties of the upper electrode 13. A structure for adjusting a temperature, which is also one of such impacting factors, is required to make uniform temperature in an upper surface of the same diameter region of the wafer W. A known structure for the upper electrode 13 satisfying this requirement is that the electrode plate 13a made of ceramics or a conductive material, free of heavy metal contamination, is placed at a position in contact with a process area, and that the cooling block 13b is laid on the electrode plate 13a. The cooling block 13b is positioned in a vacuum gas atmosphere, so that the cooling block 13b has to be provided with an intricate coolant channel meandering through the gas supply holes 12a so as not to interfere with gas supply.

There is used the cooling block 13b formed by joining two metal plates by brazing. A channel 14 through which a cooling liquid flows is formed in the cooling block 13b. The cooling block 13b should have both an excellent thermal conductivity so as to fulfill a desired heat exchange function, and an excellent electric conductivity as a passage for a radio-frequency. Thus, a metal plate made of stainless steel (hereafter referred to as "SUS") having a high resistance and a high thermal conductivity cannot be used. In place thereof, there is generally used a metal plate made of aluminum (Al) whose resistance and thermal conductivity are much lower than those of SUS.

However, when aluminum is used, since an aluminum solid surface is exposed to the cooling liquid channel 14 which is in contact with a cooling liquid, there is a possibility that an inner peripheral surface of the channel 14 is corroded by the cooling liquid circulating therethrough. The corrosion of the inner peripheral surface of the channel 14 may then result in a blockage of the cooling liquid in the channel 14. Thus, in order to avoid such situation, the inner peripheral surface of the channel 14 formed in the cooling block 13b must be subjected to an anti-corrosion treatment.

One of the anti-corrosion treatment methods is to form an aluminum oxide film on the inner peripheral surface of the channel 14 by alumite coating. However, in joining the metal plates whose surfaces have been subjected to an alumite coating process before brazing, there is concern that an alumite coating film is cracked if the alumite coating film cannot resist a brazing temperature. The cracked alumite coating film cannot fully achieve an anti-corrosion function. Alternatively, the metal plates can be subjected to the alumite coating process after the metal plates have been joined to each other by brazing. In this case, an electrolytic solution for alumite coating is poured into the channel 14. However, the complicated structure of the channel 14 may inhibit introduction of the electrolytic solution through the channel 14. Then, parts which are not coated with alumite may be left in the channel 14, i.e., pin holes may be generated in the channel 14. Further, there is concern that a foreign matter is deposited in the channel 14 by a reaction of dissolved oxygen and alumite, causing a blockage in the channel 14.

Another anti-corrosion treatment method is to coat the inner peripheral surface of the channel 14 with a resin. However, also in this method, since it is necessary to pour the resin into the channel 14, the complicated structure of the channel 14 may inhibit the pouring of the resin. Then, parts which are not coated with alumite may be left in the channel 14, i.e., pin holes may be generated in the channel 14. In addition, it is uncertain whether such cooling block 13b provides a sufficient thermal conductivity.

Another method is to arrange a pipe in the cooling block 13b. However, it is significantly difficult to intricately bend a pipe. Further, the pipe will not withstand a brazing temperature (about 600° C.) at a brazing step. Thus, this method cannot be adopted.

If a chiller is used, a convenient material such as aluminum and copper can be used, because this method is free from the need for considering the anti-corrosion property. However, it is often the case that the method is obliged to be abandoned, in terms of costs and spaces.

JP2002-86295A (especially sections 0002 and 0019) discloses a method of manufacturing a composite used in a radiator in an automobile. That is to say, there is provided a composite used as a flat tube. The composite includes three laminates, i.e., a wax member containing Si, an aluminum alloy core member, and a sacrificial member made of an Al—Zn based alloy, which are combined to each other by electric-resistance welding, with the wax member in the composite facing outside. The composite is manufactured by applying a sacrificial agent to one surface of the core member, and hot-rolling the laminates. However, there is no suggestion for a suitable structure and manufacturing method of a cooling block which forms an electrode for generating plasma for use in a plasma process.

SUMMARY OF THE INVENTION

The present invention has been made in view of the above disadvantages to effectively solve the same. The object of the present invention is to provide a long-life cooling block forming an electrode for generating a plasma for use in a plasma process, the cooling block being resistive to corrosion, while fulfilling all functions required as an electrode.

The present invention is a cooling block that forms an electrode for generating a plasma for use in a plasma process, and that includes a channel for a cooling liquid, the cooling block comprising: a first base material and a second base material respectively made of aluminum, at least one of the first and second base materials having a recess for forming a channel for a cooling liquid; and a diffusion bonding layer, in which zinc is diffused in aluminum, and an anti-corrosion layer of a zinc oxide film, the layers being formed by interposing zinc between the first and second base materials, and by bonding the first and second base materials with zinc interposed therebetween in a heating atmosphere containing oxygen.

According to the present invention, since both the first and second base materials are made of aluminum, any function required for an electrode can be fully satisfied. On the other hand, by interposing zinc between the first and second base materials to form a diffusion bonding layer of zinc to aluminum and an anti-corrosion layer of a zinc oxide film, it is easy to form the anti-corrosion layer on an inner peripheral surface of the channel through which a cooling liquid flows. Thus, it is possible to eliminate the above-described difficulties which may arise when the surface treatment is performed before brazing, and the difficulties which may arise when the surface treatment is performed after brazing. Further, the anti-corrosion layer of the zinc oxide film can be easily formed all over the channel even if it is complicated, and there is no possibility that the film is cracked. Furthermore, since bonding of the base materials and forming of the anti-corrosion layer can be carried out at the same time, the manufacturing process can be significantly simplified.

The anti-corrosion layer (zinc oxide film) serves as a sacrifice for a corrosive action of the cooling liquid to protect the aluminum base material against corrosion. Thus, the service life of the cooling block can be elongated. Since the frequency for changing the cooling block can be decreased, a maintenance operation of the cooling block can be simplified. Besides, since the anti-corrosion layer (zinc oxide film) is substantially identical to the base material (aluminum) in electric conductivity and thermal conductivity, the anti-corrosion layer does not interfere with an electric property and thermal property which ought to be provided by the cooling block forming an electrode.

Preferably, an amount of zinc contained in the zinc oxide film is 30 g or more per 1 $m^2$.

In addition, a brazing material selected from nickel, silicon, copper, boron, phosphorus, chrome, iron and carbon may be further interposed between the first and second base materials.

For example, the cooling block has a plurality of gas supply holes passing therethrough in a thickness direction, and provides an upper electrode opposed to a lower electrode on which an object to be processed is placed.

The present invention is a cooling block that forms an electrode for generating plasma for use in a plasma process, and that includes a channel for a cooling liquid, the cooling block comprising: a first base material and a second base material respectively made of aluminum, at least one of the first and second base materials having a recess for forming a channel for a cooling liquid; a first stainless plate bonded to the first base material; a second stainless plate bonded to the second base material; and a diffusion bonding layer of stainless and stainless formed at a position where the first stainless plate and the second stainless plate are bonded to each other, the diffusion bonding layer being formed by bonding the first base material, the second base material, the first stainless plate, and second stainless plate, with the first and second stainless plates being opposed and in tight contact with each other; wherein a diffusion boding layer of stainless and aluminum is formed at a position where the first aluminum base material and the first stainless plate are bonded to each other, and a diffusion bonding layer of stainless and aluminum is formed at a position where the second aluminum base material and the second stainless plate are bonded to each other.

According to the present invention, it is easy to form the channel for a cooling liquid out of stainless (SUS). The stainless channel is resistive to a corrosion by a cooing liquid, and does not interfere with an electric property and thermal property required for an electrode.

For example, the cooling block has a plurality of gas supply holes passing therethrough in a thickness direction, and provides an upper electrode opposed to a lower electrode on which an object to be processed is placed.

In this case, an inner peripheral surface of each gas supply hole is preferably coated with the first and/or second base material.

In addition, the present invention is a plasma processing apparatus comprising: a process vessel whose inside can be hermetically maintained; a stage disposed in the process vessel to hold thereon a substrate to be plasma-processed, the stage also serving as an electrode; an electrode having a cooling block according to claim 1, the electrode having the cooling block being disposed in the process vessel to be opposed to the stage; a gas supply part for introducing a process gas into the process vessel; and a plasma generating means that forms a radio-frequency electric field between the stage and the electrode having the cooling block to make the process gas plasma.

The cooling block may function as a showerhead, with a number of gas supply holes passing therethrough in a thickness direction. The cooling block can form an electrode by itself. However, in general, the cooling block forms an electrode together with an electrode plate which has a number of gas supply holes but does not have a channel for a cooling liquid.

Preferably, an amount of zinc contained in the zinc oxide film is 30 g or more per 1 $m^2$.

In addition, the present invention is a method of manufacturing a cooling block that forms an electrode for generating a plasma for used in a plasma process, the method comprising the steps of: preparing a first base material and a second base material respectively made of aluminum, at least one of the first and second base materials having a recess for forming a channel for a cooling liquid; forming simultaneously a diffusion bonding layer, in which zinc is diffused in aluminum, and an anti-corrosion layer of a zinc oxide film, by interposing zinc between the first and second base materials and by bonding the first and second base materials with zinc interposed therebetween in a heating atmosphere containing oxygen.

DETAILED DESCRIPTION OF THE INVENTION

Embodiments of the cooling block according to the present invention will be described in detail below with reference to the attached drawings.

First Embodiment

Figure 1:
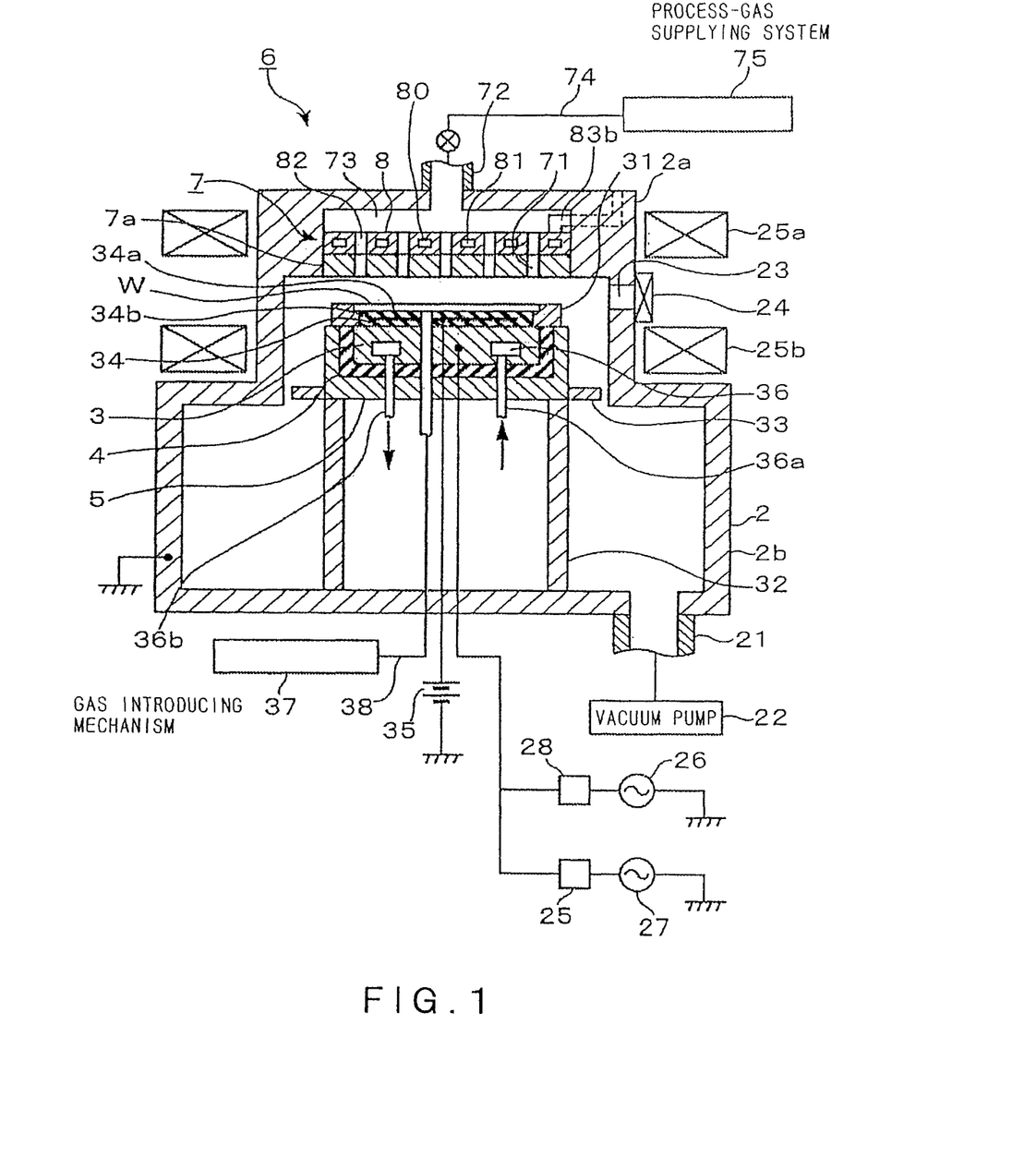
FIG. 1 is a schematic sectional view of an RIE plasma etching apparatus including a cooling block in one embodiment of the present invention.

FIG. 1 is a schematic sectional view of an RIE (Reaction Ion Etching) plasma etching apparatus including a cooling block in a first embodiment of the present invention. As shown in FIG. 1, the plasma etching apparatus in this embodiment includes a process vessel 2 (vacuum chamber) made of, e.g., aluminum. The process vessel 2, which has an upper cylindrical part 2a of a smaller diameter and a lower cylindrical part 2b of a larger diameter, can be hermetically sealed.

In the process vessel 2, there is disposed a support table 3, which supports horizontally a semiconductor wafer W (hereafter referred to as "wafer") as a substrate to be processed and also serves as a lower electrode. The support table 3 is made of, e.g., aluminum, and is supported by a conductive support base 5 via an insulating plate 4. A focus ring 31 made of, e.g., silicon (Si) is disposed on an upper periphery of the supporting table 3. A lower part of the support base 5 is covered with a cover 32. A baffle plate 33 is disposed outside the support base 5. The baffle plate 33 is conducted to the process vessel 2 through the support base 5 and the cover 32. The process vessel 2 is grounded.

A showerhead 6 is disposed on a top wall of the process vessel 2. The showerhead 6 performs as a gas supply part for introducing a process gas into the process vessel 2. A lower surface of the showerhead 6 provides an upper electrode 7 functioning as a shower plate. The upper electrode 7 is formed of a disc-shaped electrode plate 7a of, e.g., 20 mm in thickness, and a disc-shaped cooling block 80 of, e.g., 20 mm in thickness laid on the electrode plate 7a. The electrode plate 7a is located on a region in contact with a process area, and is made of ceramics or a conductive material, free of heavy metal contamination. The upper electrode 7 is arranged in parallel with the support table 3 serving as a lower electrode. That is, the support table 3 as a lower electrode and the upper electrode 7 constitute a pair of parallel plate electrodes. The electrode plate 7a is provided with a number of gas jetting holes 71. The upper electrode 7 is a member for emitting electric flux lines, for making a process gas plasma. Thus, in order to generate a plasma offering an excellent in-plane uniformity in a surface of the wafer W, a size of the upper electrode 7 is preferably equal to or larger than a size of the surface to be processed of the wafer W. The upper electrode 7 is grounded via the process vessel 2.

An outlet port 21 is formed in a bottom wall of the lower part 2b of the process vessel 2. A vacuum pump 22 is connected to the outlet port 21. By actuating the vacuum pump 22, a pressure in an inside of the process vessel 2 can be reduced to a predetermined vacuum degree. A loading/unloading port 23 is formed in a sidewall of the upper part 2a of the process vessel 2, through which the wafer W is loaded and unloaded. The loading/unloading port 23 is opened and closed by a gate valve 24.

A first radio-frequency power source 26 for generating plasma is connected to the support table 3 via a matching device 28. A second radio-frequency power source 27 for drawing ion is connected to the support table 3 via a matching device 25. A radio-frequency power of a predetermined frequency is supplied from the first radio-frequency power source 26 to the support table 3. A radio-frequency power, whose frequency is lower than that of the radio-frequency power from the first radio-frequency power source 26, is supplied from the second radio-frequency power source 27 to the support table 3.

An electrostatic chuck 34 for electrostatically absorbing the wafer W is disposed on a surface of the support table 3. The electrostatic chuck 34 is formed by interposing an electrode 34a between insulating members 34b. A DC power source 35 is connected to the electrode 34a. When a voltage is applied to the electrode 34a from the DC power source 35, the wafer W is absorbed by an electrostatic force such as Coulomb force.

A cooling chamber 36 is disposed in the support table 3. A coolant is circulated through the cooling chamber 36, by introducing the coolant thereinto through a coolant introducing pipe 36a and discharging the coolant through a coolant discharging pipe 36b. A cold heat of the coolant is transferred to the wafer W through the support table 3, whereby a surface of the wafer W can be controlled to have a desired temperature.

In order that the wafer W can be effectively cooled by the (circulating) coolant introduced into the cooling chamber 36 even when the process vessel 2 is evacuated by the vacuum pump 22 to be in substantially a vacuum condition, a cooling gas can be introduced between a surface of the electrostatic chuck 34 and a rear surface of the wafer W from a gas introducing mechanism 37 through a gas supply line 38. Due to the introduction of the cooling gas, the cold heat of the coolant can be effectively transferred to the wafer W, whereby a cooling efficiency of the wafer W can be enhanced.

A gas inlet port 72 is formed in an upper part of the showerhead 6. A space 73 in which a gas is diffused is formed in the showerhead 6. One end of a gas supply pipe 74 is connected to the gas inlet port 72. A process gas supply system 75 is connected to the other end of the gas supply pipe 74.

A multipole ring magnet is arranged concentrically around the upper part 2a of the process vessel 2. In this embodiment, there are arranged two multipole ring magnets, i.e., an upper multipole ring magnet 25a and a lower multipole ring magnet 25b, with the loading/unloading port 23 positioned therebetween. Each of the multipole ring magnets 25a and 25b is formed of a plurality of anisotropic segment columnar magnets which are attached to a ring-shaped magnetic casing. Magnetic poles of the adjacent segment columnar magnets are oriented in the mutually reverse direction. Owing to this arrangement, lines of magnetic force are formed between the adjacent segment magnets, and a magnetic field is formed only an area surrounding the process space between the upper and lower electrodes. Such a magnetic field can confine a plasma within the process space.

Figure 2:
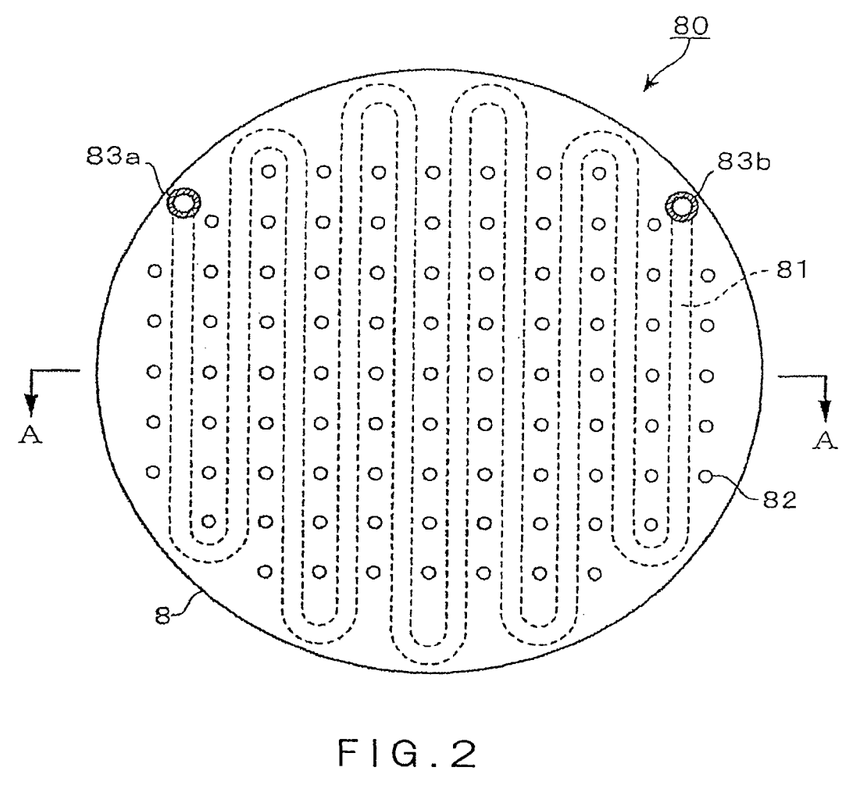
FIG. 2 is an enlarged plan view of the cooling block in the apparatus shown in FIG. 1.

Next, the cooling block 80 is described in detail. The cooling block 80 comprises a base material 8 made of aluminum (Al). As shown in FIG. 2, a meandering channel 81 is formed in the base material 8 through which a cooling liquid such as water flows. A number of gas jetting holes 82 are substantially uniformly drilled in the base material 8 in such a manner that the holes 82 avoid the channel 81 (in this example, the holes 82 are formed in an area between the adjacent portions of the channel 81).

The gas jetting holes 82 are arranged so as to correspond to the gas jetting holes 71 formed in the electrode plate 7*a*, when the electrode plate 7*a* is superposed on the cooling block 80. A process gas is supplied to the process space between the upper and lower electrodes through the gas jetting holes 71 and 82.

A cooling liquid is introduced into the channel 81 through a cooling liquid introducing pipe 83*a*, and is discharged through a cooing liquid discharging pipe 83*b*. Passing then through a temperature adjusting apparatus outside the plasma processing apparatus, the cooling liquid is circulated. Thus, a temperature of the upper electrode 7 can be set at a predetermined one, thereby controlling a plasma generated above the wafer W in a suitable condition for a desired process.

Figure 3:
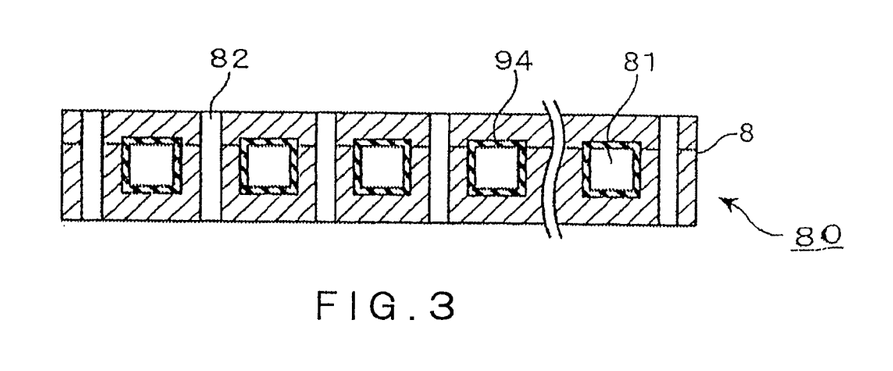
FIG. 3 is an enlarged sectional view of the cooling block in FIG. 2.

As shown in FIG. 2, the cooling liquid introducing pipe 83*a* and the cooling liquid discharging pipe 83*b* respectively extend upward from an upper surface of the cooling block 80 to be connected to a channel in the upper part 2*a* of the process vessel 2 (in FIG. 1, the cooling liquid introducing pipe 83*a* is invisible by the cooling liquid discharging pipe 83*b*). As shown in FIG. 3, a zinc oxide film (anti-corrosion film) 94, which will be described hereinbelow, is formed all over an inner peripheral surface of the channel 81.

A manufacturing method of the cooling block 80 is concretely described with reference to FIGS. 4A to 5C.

Figure 4A:
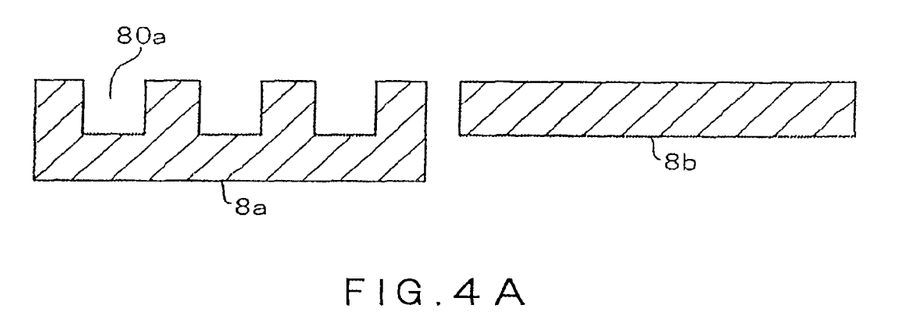
FIGS. 4A and 4B are sectional views of assistance in explaining a manufacturing method of the cooling block shown in FIGS. 2 and 3.

At first, there are prepared a first base material (lower member) 8*a* made of aluminum having on its upper surface recesses 80*a* for forming a channel for a cooling liquid, and a second base material (upper member) 8*b* made of aluminum having flat upper and lower surfaces (see, FIG. 4A).

Figure 4B:
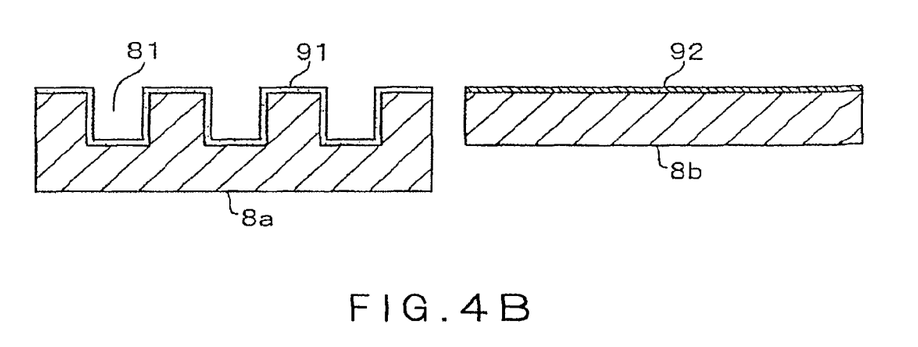

Then, a coating liquid (slurry) formed by dispersing zinc (Zn) powder in a medium such as a solvent is applied to the upper surface of the first base material 8*a* by a gas spray or the like. It is preferable to spray 30 g or more of zinc per 1 m². A coating liquid (slurry) formed by dispersing a brazing material such as nickel (Ni) powder in a solvent is applied to an upper surface of the second base material 8*b*. Thus, as shown in FIG. 4B, a Zn coating film 91 is formed on the upper surface (surface having the recesses) of the first base material 8*a*, and an Ni coating film 92 is formed on the surface of the second base material 8*b*.

Figure 5A:
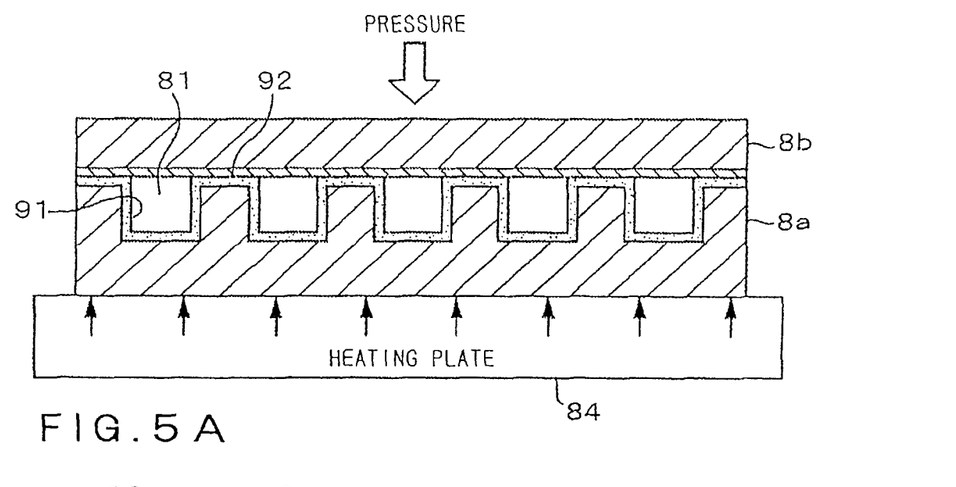
FIGS. 5A to 5C are, following FIGS. 4A and 4B, sectional views of assistance in explaining the manufacturing method of the cooling block shown in FIGS. 2 and 3.
Figure 5B:
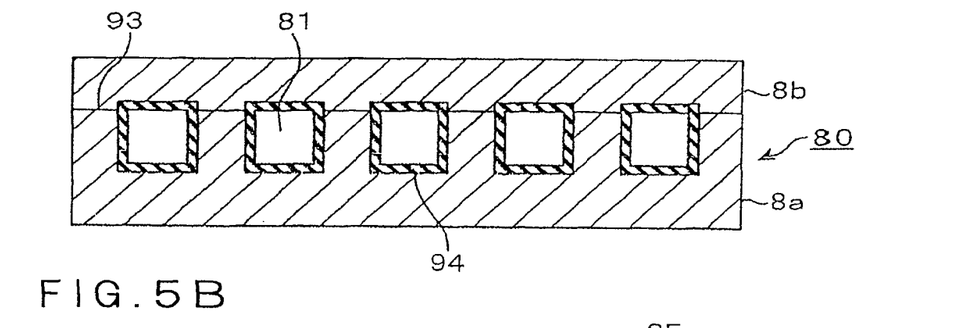

Thereafter, the first and second base materials 8*a* and 8*b* are loaded into a heating furnace of a reduced-pressure atmosphere containing oxygen, such as a reduced-pressure air atmosphere, with the upper surface of the first base material 8*a* having the Zn coating film 91 formed thereon and the surface of the second base material 8*b* having the Ni coating film 92 formed thereon being attached to each other. As shown in FIG. 5A, the first and second base materials 8*a* and 8*b* are heated, with the lower surface of the first base material 8*a* being supported by a supporting member 84, while the upper surface of the second base material 8*b* being urged to the lower surface of the first base material 8*a* by a pressure. The zinc and nickel are diffused in the aluminum and bonded thereto at a bonding boundary surface by diffusion bonding. Thus, as shown in FIG. 5B, a bonding layer (diffusion bonding layer) 93 made of Al—Zn—Ni is formed. The recesses 80*a* in the first base material 8*a* are covered with the second base material 8*b* to thereby define the channel 81 in the cooling block 80. The zinc oxide film 94 is formed inside the recesses 80*a* by zinc and oxygen. That is to say, the zinc oxide film 94 is formed in the overall inner surface of the channel 81. To be more precise, the zinc oxide film 94 in this embodiment is a Zn—Ni—Al composite oxide film.

Figure 5C:
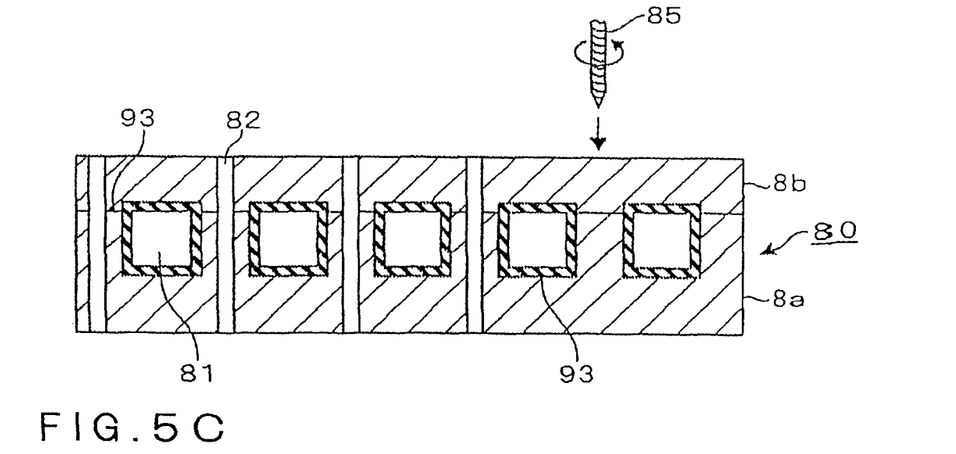

Following thereto, as shown in FIG. 5C, the gas jetting holes 82 with a diameter between 0.5 to 1 mm, for example, are formed in the cooling block 80 in areas between the adjacent portions of the channel 81 by means of a cutting tool such as a drill 85.

Although the recesses 80*a* are formed in the upper surface of the first base material 8*a* in this embodiment, the recesses 80*a* may be formed in one of the surfaces of the second base material 8*b*. Alternatively, the recesses 80*a* may be formed in each of the opposed surfaces of the first and second base materials 8*a* and 8*b* at positions corresponding to each other, so that the channel 81 is formed by the recesses 80*a* formed in both the base materials 8*a* and 8*b*.

Next, an example of an operation of the plasma etching apparatus as structured above is described below.

At first, the gate valve 24 is opened, and the wafer W is loaded into the process vessel 2 through the loading/unloading port 23 and is placed on the support table 3. By applying a predetermined voltage from the DC power source 35 to the electrode 34*a* of the electrostatic chuck 34, the wafer W is absorbed and held by the electrostatic chuck 34. Thereafter, the atmosphere in the process vessel 2 is discharged by the vacuum pump 22 through the outlet port 21 to a predetermined vacuum degree.

A process gas such as fluorine (F) is supplied from the process gas supply system 75 through the gas supply pipe 74 and the gas inlet port 72 to the space 73 in the showerhead 6. The process gas passes through the gas jetting holes 82 in the cooling block 80 and the gas jetting holes 71 in the electrode plate 7*a* to be jetted to the process space. A gas pressure in the process vessel 2 is set at, e.g., 13 to 1,333 Pa (100 mTorr to 10 Torr). Under this pressure condition, a radio-frequency power of e.g., 100 MHz is supplied from the first radio-frequency power source 26 to the support table 3. Flowing through the support table 3, the process space, the upper electrode 7 (cooling block 80), and the process vessel 2, the radio-frequency forms a radio-frequency electric field in the process atmosphere.

A radio-frequency power of, e.g., 3.2 MHz is supplied from the second radio-frequency power source 27 so as to control an ion energy of a plasma. This radio-frequency also forms a radio-frequency electric field between the upper electrode 7 and the support table 3 as the lower electrode. A horizontal magnetic field is formed between the showerhead 6 and the support table 3 by the dipole ring magnets 25*a* and 25*b*. Thus, a transverse electromagnetic field is formed in the process space between the electrodes where the wafer W is placed. The transverse electromagnetic field causes a drift of electrons, which causes a magnetron electric discharge. Due to the magnetron electric discharge, the process gas is made plasma, and a predetermined film formed on the surface of the wafer W is etched by the plasma.

Meanwhile, a cooling liquid such as water is introduced to the channel 81 in the cooling block 80 through the cooling liquid introducing pipe 83*a*. Thus, the electrode plate 7*a* is adjusted through the cooling block 80, in such a manner that a lower surface of the electrode plate 7a is uniformly maintained at a set temperature of, e.g., 60° C. This contributes an in-plane uniformity in electron density of the plasma above the wafer W.

In the above embodiment, since the base material 8 of the cooling block 80 is made of aluminum, the function(s) required for the upper electrode 7 can be sufficiently satisfied. The base materials 8a and 8b made of aluminum are bonded to each other with zinc therebetween. Thus, as shown in FIG. 5B, forming of the diffusion bonding layer in which zinc is diffused in aluminum and forming of the zinc oxide film 94 on the inner peripheral surface of the channel 81, through which a cooling liquid flows, can be simultaneously carried out. Thus, it is possible to eliminate the above-described difficulties which may arise when the surface treatment is performed before brazing, and the difficulties which may arise when the surface treatment is performed after brazing. Further, the zinc oxide film 94 can be easily formed all over the channel even if it is complicated, and there is no possibility that the film is cracked. Furthermore, since bonding of the base materials and forming of the zinc oxide film 94 can be carried out at the same time, the manufacturing process can be significantly simplified.

In addition, the zinc oxide film 94 serves as a sacrifice for a corrosive action of the cooling liquid to protect the aluminum base materials 8a and 8b against corrosion. Thus, the service life of the cooling block 80 can be elongated. Even if the zinc oxide film 94 is cracked to generate pin holes, the corrosion of aluminum can be suppressed, because zinc is corroded prior to aluminum in terms of electronegativity. Thus, the frequency for changing the cooling block 80 can be decreased, which results in simplifying a maintenance operation of the cooling block 80. Besides, since the zinc oxide film 94 is substantially identical to the aluminum base materials 8a and 8b in electric conductivity and thermal conductivity, the zinc oxide film 94 does not interfere with an electric property and thermal property which ought to be provided by the cooling block 80 forming an electrode.

In the above embodiment, although the cooling block 80 is disposed on the upper surface of the electrode plate 7a, the cooing block 80 may be disposed on a side of the support table 3 to form a part of a lower electrode.

Second Embodiment

In a cooling block in a second embodiment of the present invention, an inner surface of a channel 81 formed in a base material 8 is entirely covered with stainless steel (SUS).

A manufacturing method of such cooling block 90 is concretely described with reference to FIGS. 6A to 7D.

Figure 6A:
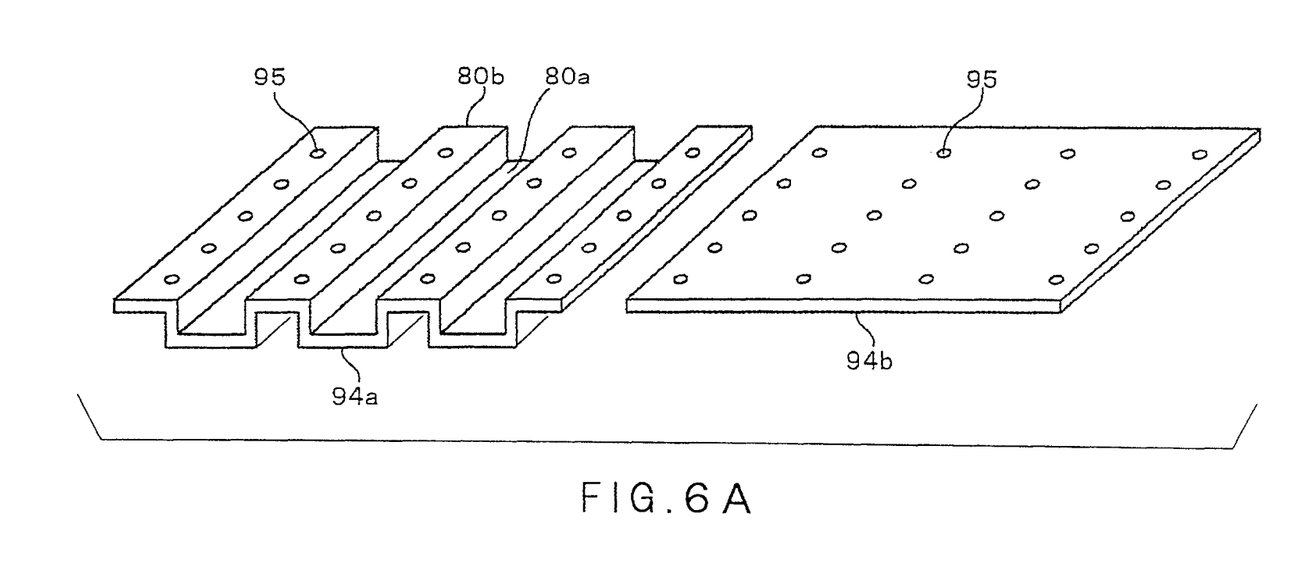
FIG. 6A is a perspective view of assistance in explaining another manufacturing method of the cooling block shown in FIGS. 2 and 3.
Figure 6B:
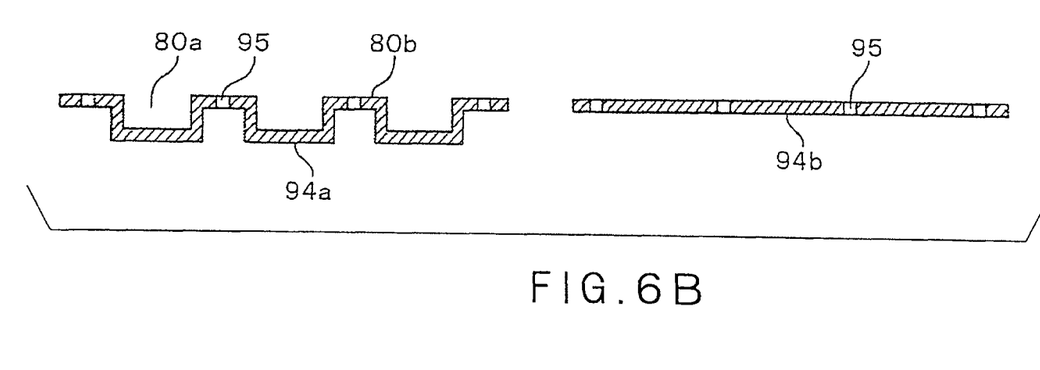
FIG. 6B is a sectional view of assistance in explaining the another manufacturing method of the cooling block shown in FIGS. 2 and 3.

At first, as shown in FIGS. 6A and 6B, a lower plate 94a made of SUS is processed to have, e.g., parallel grooves as recesses 80a for forming a channel. Holes 95 are drilled in ridges 80b between the grooves in the lower plate 94a. A diameter of the hole 95 is larger than that of a gas jetting hole formed in a base material, which is described below. A flat upper plate 94b made of SUS is also provided with the holes 95, each having a diameter larger than the hole formed in the base material, which is described below. The holes 95 drilled in the lower plate 94a and the holes 95 drilled in the upper plate 94b are arranged so as to correspond to each other, when the lower plate 94a and the upper plate 94b are stacked with each other. In order to form a round plate having therein a meandering recess as shown in FIG. 2, the lower plate 94a may be manufactured by processing a plurality of plate elements and welding the same. The plates shown in FIG. 6A may be regarded as such plate elements.

Then, lower surfaces of the lower plate 94a and the upper plate 94b are immersed in a crucible of melted aluminum. After the aluminum is cooled and made solid, the lower plate 94a and upper plate 94b are taken out from the crucible. Thus, diffusion bonding of SUS-Al, in which SUS is diffused in aluminum, is achieved at a boundary surface where SUS and Al are in contact with each other. An aluminum base material 8a and an aluminum base material 8b are formed on the lower surfaces of the lower plate 94a and the upper plate 94b, respectively (see, FIG. 7A). The holes 95 formed in the lower plate 94a and the upper plate 94b are filled with Al.

Figure 7A:
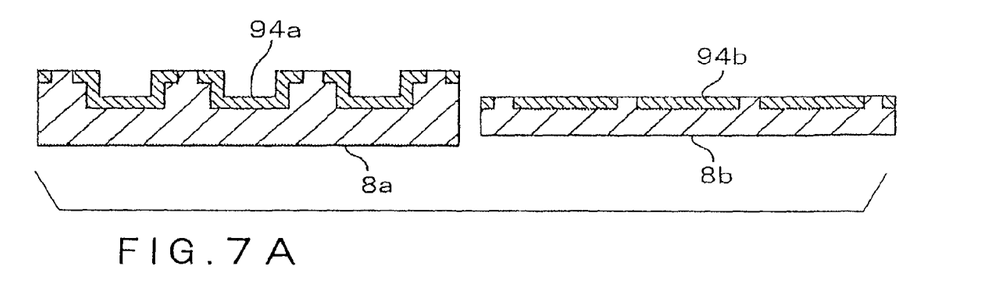
FIGS. 7A to 7D are, following FIGS. 6A and 6B, sectional views of assistance in explaining the another manufacturing method of the cooling block shown in FIGS. 2 and 3.
Figure 7B:
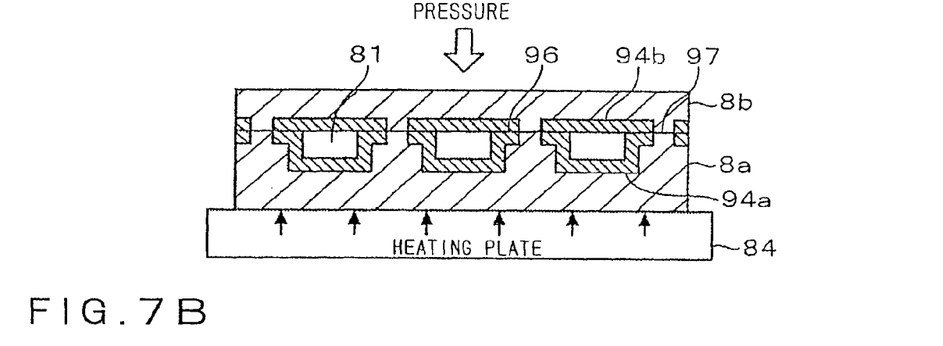
Figure 7C:
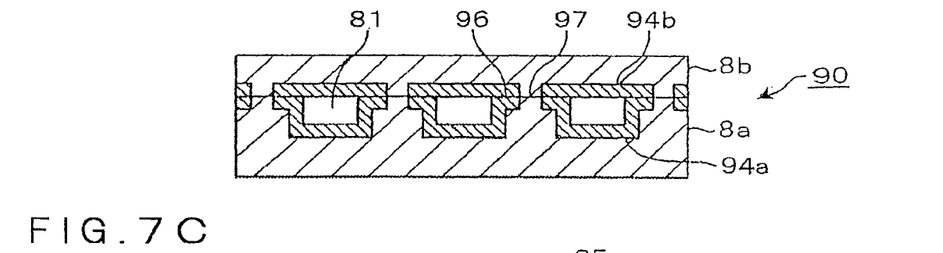

Thereafter, the lower plate 94a and the upper plate 94b are attached to each other, and are loaded into a heating furnace of, e.g., a reduced-pressure air atmosphere. As shown in FIG. 7B, the plates 94a and 94b are heated, with the lower plate 94a being supported by a supporting member 84, while an upper surface of the upper plate 94b being urged by a pressure. Thus, a bonding layer (diffusion boding layer) 96 of SUS-SUS is formed by diffusion bonding on a boundary surface where the lower plate 94a and the upper plate 94b are bonded to each other. The recesses 80a in the lower plate 94a are covered with the upper plate 94b to thereby define a channel 81 in the cooling block 90. A bonding layer (diffusion bonding layer) 97 of Al—Al is formed in a boundary surface where the Al in the holes 95 in the lower plate 94a and the Al in the holes 95 in the upper plate 94b are bonded to each other. Following thereto, the bonded upper and lower plates 94b and 94a are cooled so that the cooling block 90 is obtained (see, FIG. 7C). The holes 95 in the plates 94a and 94b made of SUS are filled with Al. Gas jetting holes 82 are drilled in these portions in the succeeding step.

Figure 7D:
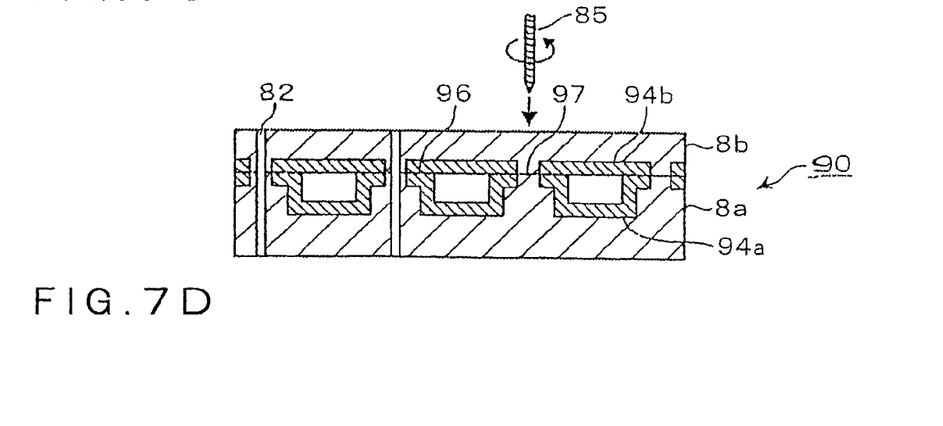

As shown in FIG. 7D, by drilling the holes 95 filled with Al by means of a drill 85 having a diameter smaller than that of the hole 95, the gas jetting holes 82 are formed in the cooling block 90 at positions corresponding to the holes 95 in the plates 94a and 94b.

In this embodiment, although the recesses 80a are formed in one surface of the lower plate 94a, the recesses 80a may be formed in one surface of the upper plate 94b. Alternatively, the recesses 80a may be formed in each of the opposed surfaces of the lower plate 94a and the upper plate 94b at positions corresponding to each other, so that the channel 81 is formed by the recesses 80a formed in both the plates 94a and 94b.

In manufacturing the cooling block 90, an outer surface of each of the aluminum base material 8a and 8b may be subjected to an alumite coating treatment.

The cooling block 90 obtained by the above method can be applied to the plasma processing apparatus shown in FIG. 1.

In the above embodiment, the channel 81 for a cooling liquid is made of stainless (SUS). Since the stainless channel 81 is resistive to a corrosion by a cooling liquid, a service life of the cooling block 90 can be prolonged.

In addition, although the channel 81 made of SUS having a high resistivity and thermal conductivity is included in the cooling block 90, the stainless channel 81 does not interfere with an electric property and thermal property which ought to be provided by the cooling block 90 as an electrode. This is because, since parts other than the channel 81 are made of aluminum, the outer aluminum parts provide a main path through which radio-frequency and heat pass.

In the above embodiment, since an inner peripheral surface of each gas jetting hole 82 is coated with Al, there is no possibility that SUS is corroded by a process gas when the process gas is jetted through the gas jetting holes 82. This also contributes to extension of service life of the cooling block 90.

A substrate in the present invention is not limited to a wafer as explained in the above embodiments. For example, the substrate may be a glass substrate, for a flat panel used in a liquid crystal display or plasma display, or a ceramic substrate.

EXAMPLES

Next, an experiment conducted for verifying the effects of the present invention are described.

Example 1

A test block corresponding to the cooling block 80 was manufactured in accordance with the same procedures as those of the first embodiment (see, FIGS. 4A to 5C).

An amount of zinc applied to the surface of the first base material 8a was 30 g per 1 $m^2$. A brazing material containing 80% or more by weight of Ni was applied to the surface of the second base material 8b. The cooling block manufactured as above is called Example 1.

Example 2

A cooling block was manufactured in accordance with the same procedures as those of Example 1, except for that an amount of zinc applied to the surface of the first base material 8a was 60 g per 1 $m^2$. The cooling block as manufactured above is called Example 2.

Comparative Example

A cooling block was manufactured in accordance with the same procedures as those of Example 1, except for that no zinc was applied to the base material 8a. The cooling block as manufactured above is called Comparative Example.

(Procedures, Conditions, and Results of Experiment)

5,000 ml of corrosion accelerating liquid having a pH of 6.4 to 6.8 (actual measurement value 6.6) was circulated through a circulation path including a channel formed in each of the cooling blocks of Example 1, Example 2, and Comparative Example. Components contained in the 5,000 ml of corrosion accelerating liquid were: 10 ppm of copper ion; 100 ppm of chlorine ion; 100 ppm of sulfate ion; and 100 ppm of bicarbonate ion. The corrosion accelerating liquid circulating the channel was replaced with a new corrosion accelerating liquid for every one week.

Figure 8:
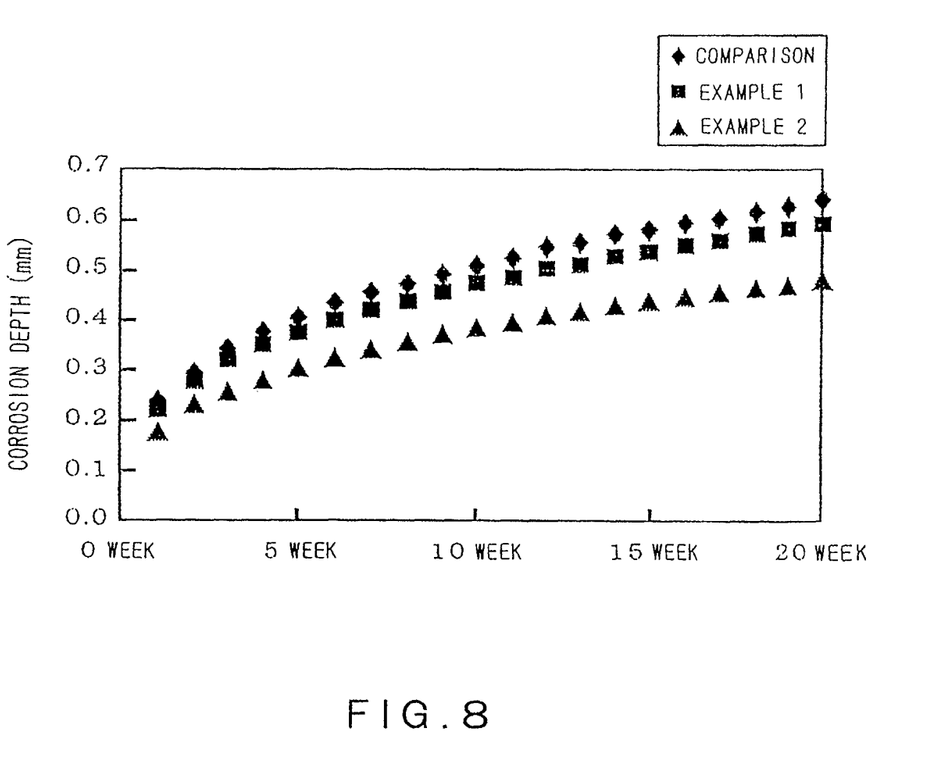
FIG. 8 is a graph showing the result of the experiment conducted for evaluating the effects of the present invention.

The states of the channels in the blocks corroded by the circulating corrosion accelerating liquid were observed for every one week (1st week, 2nd week ... 20th week) according to the following manner. That is, a portion of 25 mm in length of the channel of each of the cooling block of Example 1, Example 2, and Comparative Example was cut out. Then, the cut-out portion was divided at the brazing portion (bonding portion), and a corrosion state in the cross-section was observed. FIG. 8 shows the experiment result. In FIG. 8, the axis of ordinate depicts a corrosion depth (mm), and the axis of abscissa depicts a period of time for circulating the corrosion accelerating liquid.

As apparent from FIG. 8, the progress of corrosion in Examples 1 and 2 is slower than that of Comparative Example. In other words, to reach the corrosion depth of 0.48 mm, it took eleven weeks for Example 1, and 20 weeks for Example 2. On the other hand, it took 8.5 weeks for Comparative Example. Namely, it can be seen that the service life of Example 1 is about 1.3 times as long as that of Comparative Example, and that the service life of Example 2 is about 2.4 times as long as that of Comparative Example. This is because the zinc oxide film 94 serves as a sacrifice of the corrosion by the corrosion accelerating liquid. Further, since a potential of zinc oxide is lower than that of aluminum, the zinc oxide film 94 is corroded slower than the aluminum parts. As can be understood from the result, it is effective to form the zinc oxide film 94 on the whole inner surface of the channel 81 of the cooling block 80. As described above, Example 2 has a longer service life than Example 1 does. Thus, it can be understood that, the larger the amount of zinc applied to the surface of the first material 8a is, the more effectively the corrosion depth can be suppressed. Note that, although the 60 g of zinc per 1 $m^2$ is preferred, even the 30 g of zinc per 1 $m^2$ can produce a sufficiently remarkable effect.

The invention claimed is:

1. A cooling block that cools an electrode for generating a plasma for use in a plasma process, the cooling block comprising:
   a first base member consisting essentially of aluminum,
   a second base member consisting essentially of aluminum,
   a diffusion bonding layer bonding the first base member and the second base member together so that a side of the first base member faces a side of the second base member, wherein
   at least one of said side of the first base member and said side of the second base member provides convex portions forming a fluid channel for introduction of a cooling medium,
   the first base member and the second base member have a gas supply hole formed therethrough for introduction of a gas, and
   the diffusion bonding layer bonds the first base member and the second base member together at the convex portions, and consists essentially of aluminum from the first and second base members, a brazing material consisting essentially of nickel provided by the first base member, and anti-corrosion material consisting essentially of zinc provided by the second base member, and
   wherein the cooling block further comprises an anti-corrosion layer formed in the fluid channel, the anti-corrosion layer consisting essentially of an oxide of the aluminum from the first and the second base members, the nickel from the brazing material, and the zinc from the anti-corrosion material.

2. The cooling block according to claim 1, wherein the diffusion bonding layer is formed by heating the brazing material on the first base member and the anti-corrosion material on the second base member under a reduced pressure with oxygen.

3. The cooling block according to claim 1, wherein the anti-corrosion layer is a composite oxide of Ni—Zn—Al.

4. The cooling block according to claim 1, wherein at least two concave portions and one of the convex portions therebetween form the fluid channel.

5. The cooling block according to claim 1, wherein the brazing material includes 80% or more by weight of Ni.

6. The cooling block according to claim 1, wherein the anti-corrosion material includes 30 g or more per 1 $m^2$ of zinc.

7. A plasma processing apparatus comprising:
   a process vessel whose inside can be hermetically maintained;
   a stage disposed in the process vessel to hold thereon a substrate to be plasma-processed, the stage also serving as a lower electrode;

an upper electrode arranged opposite to the stage in the processing vessel, and
a plasma generating unit that forms a radio-frequency electric field between the stage and the upper electrode to generate a plasma,
wherein the upper electrode includes:
an electrode plate, and
a cooling block provided on the electrode plate for cooling the electrode plate,
wherein the cooling block includes:
a first base member consisting essentially of aluminum,
a second base member consisting essentially of aluminum,
a diffusion bonding layer bonding the first base member and the second base member together so that a side of the first base member faces a side of the second base member, wherein
at least one of said side of the first base member and said side of the second base member provides convex portions forming a fluid channel for introduction of a cooling medium,
the first base member and the second base member have a gas supply hole formed therethrough for introduction of a gas, and
the diffusion bonding layer bonds the first base member and the second base member together at the convex portions, and consists essentially of aluminum from the first and the second base members, a brazing material consisting essentially of nickel provided by the first base member, and an anti-corrosion material consisting essentially of zinc provided by the second base member, and
wherein the cooling block further comprises an anti-corrosion layer formed in the fluid channel, the anti-corrosion layer consisting essentially of an oxide of the aluminum from the first and the second base members, the nickel from the brazing material, and the zinc from the anti-corrosion material.

8. The plasma processing apparatus according to claim 7, wherein
the diffusion bonding layer is formed by heating the brazing material on the first base member and the anti-corrosion material on the second base member under a reduced pressure with oxygen.

9. The plasma processing apparatus according to claim 7, wherein the anti-corrosion layer is a composite oxide of Ni—Zn—Al.

10. The plasma processing apparatus according to claim 7, wherein
at least two concave portions and one of the convex portions therebetween form the fluid channel.

11. A cooling block that cools an electrode for generating a plasma for use in a plasma process, the cooling block comprising:
a first base member formed of a first base material;
a second based member formed of a second base material; and
a diffusion bonding layer bonding the first base member and the second base member together so that a side of the first base member faces a side of the second base member, wherein
at least one of said side of the first base member and said side of the second base member provides convex portions forming a groove therebetween for a cooling medium,
the first base member and the second base member have a gas supply hole formed therethrough for introduction of a gas, and
the diffusion bonding layer bonds the first base member and the second base member together at the convex portions, and includes the first base material, the second base material, a brazing material provided by the first base member and an anti-corrosion material provided by the second base member, and
wherein the cooling block further comprises an anti-corrosion layer formed in the groove, the anti-corrosion layer consisting of an oxide of the first base material, the second base material, the brazing material and the anti-corrosion material.

12. The cooling block according to claim 11, wherein the first base material and the second base material are aluminum.

13. The cooling block according to claim 11, wherein the brazing material is nickel.

14. The cooling block according to claim 11, wherein the diffusion bonding layer consists essentially of Al—Zn—Ni.

15. The cooling block according to claim 11, wherein
the diffusion bonding layer is formed by heating the brazing material on the first base member and the anti-corrosion material on the second base member under a reduced pressure with oxygen.

16. The cooling block according to claim 15, wherein the anti-corrosion layer is a composite oxide of Ni—Zn—Al.

* * * * *